United States Patent
Nakao

(10) Patent No.: US 7,206,370 B2
(45) Date of Patent: Apr. 17, 2007

(54) CLOCK RECOVERY CIRCUIT

(75) Inventor: Takehiko Nakao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 852 days.

(21) Appl. No.: 10/393,277

(22) Filed: Mar. 21, 2003

(65) Prior Publication Data

US 2004/0022339 A1   Feb. 5, 2004

(30) Foreign Application Priority Data

Mar. 27, 2002   (JP)   ............... 2002-089773

(51) Int. Cl.
*H03D 3/24*   (2006.01)
(52) U.S. Cl. .............. 375/376; 375/371; 375/373; 341/143
(58) Field of Classification Search .............. 375/371, 375/373, 376; 341/143
See application file for complete search history.

(56) References Cited

U.S. PATENT DOCUMENTS

| | | | |
|---|---|---|---|
| 4,042,781 A * | 8/1977 | Dragotinov | 370/507 |
| 4,628,475 A * | 12/1986 | Azusawa et al. | 708/845 |
| 5,068,628 A | 11/1991 | Ghoshal | |
| 5,812,619 A | 9/1998 | Runaldue | |
| 5,886,552 A * | 3/1999 | Chai et al. | 327/165 |
| 6,359,948 B1 * | 3/2002 | Turudic et al. | 375/376 |
| 6,456,128 B1 * | 9/2002 | Nakamura | 327/149 |
| 6,741,668 B1 * | 5/2004 | Nakamura | 375/376 |
| 6,954,506 B2 * | 10/2005 | Cho | 375/321 |
| 2001/0026179 A1 * | 10/2001 | Saeki | 327/147 |
| 2001/0038675 A1 | 11/2001 | Zortea et al. | |
| 2002/0196889 A1 * | 12/2002 | Tamura et al. | 375/373 |
| 2004/0094021 A1 * | 5/2004 | Ludwig | 84/625 |

FOREIGN PATENT DOCUMENTS

| | | |
|---|---|---|
| EP | 0 480 165 | 4/1992 |
| JP | 1-175427 | 7/1989 |
| JP | 5-268077 | 10/1993 |
| JP | 223147 | 8/1996 |
| JP | 10-285150 | 10/1998 |
| JP | 2001-210020 | 8/2001 |
| WO | WO 99/22482 | 5/1999 |

* cited by examiner

*Primary Examiner*—Mohammed Ghayour
*Assistant Examiner*—Erin M. File
(74) *Attorney, Agent, or Firm*—Oblon, Spivak, McClelland, Maier & Neustadt, P.C.

(57) ABSTRACT

A clock recovery circuit comprises a phase comparator detecting phase differences between input data and sampling clocks and outputs them as pulse signals of two values of advanced and delayed, a low-pass filter reducing frequencies of the pulse signals outputted from the phase comparator and outputs reduced frequencies, a control signal generator monitoring the reduced frequencies and generates a phase control signal used to adjust the phase of each sampling clock to be small or large based on the ratio of the advanced and delayed signals, a phase interpolator adjusting the phase of each sampling clock upon receiving the phase control signal, and a frequency divider dividing the sampling clock having the adjusted phase by a predetermined frequency division ratio to output it, and controls the low-pass filter and control signal generator based on the frequency divided output.

12 Claims, 8 Drawing Sheets

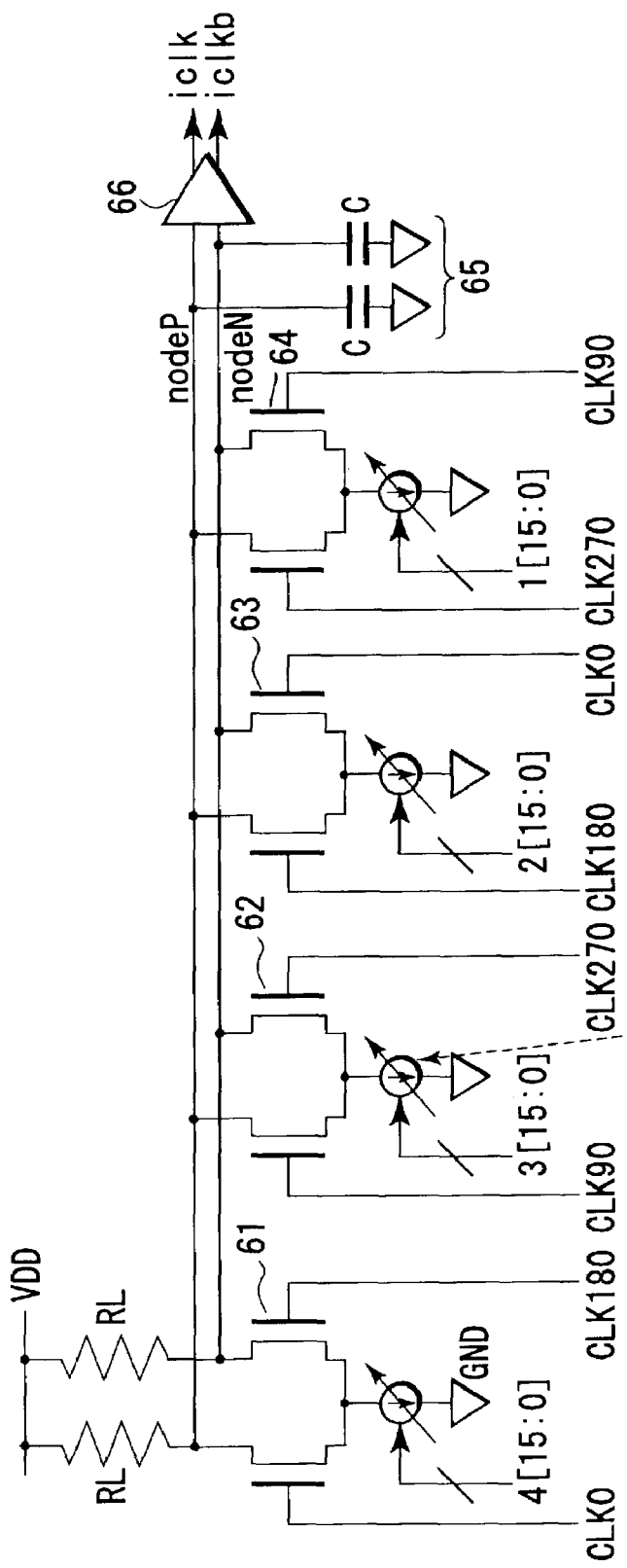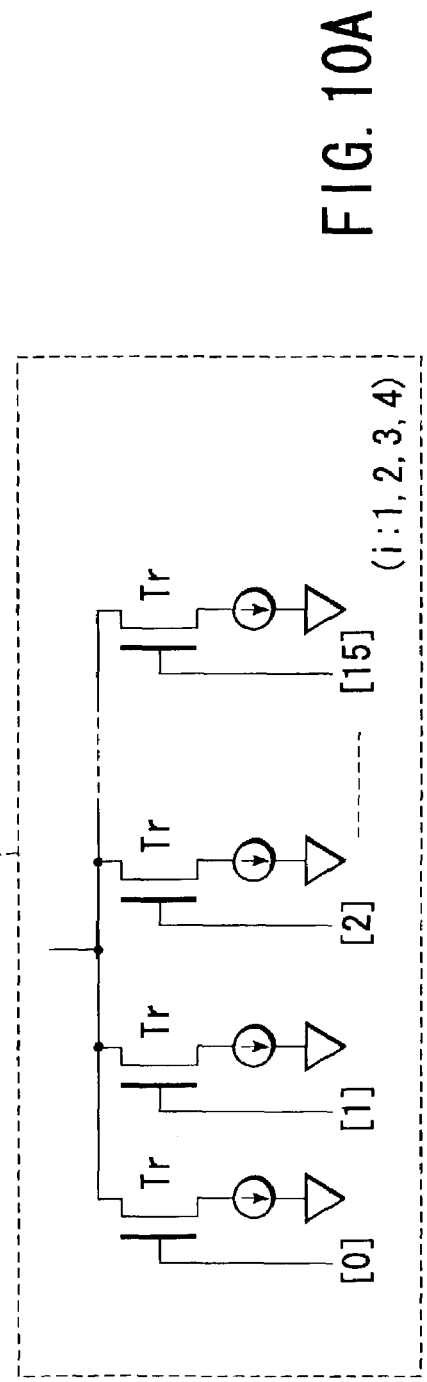
FIG. 10A

CLOCK RECOVERY CIRCUIT

CROSS-REFERENCE TO RELATED APPLICATIONS

This application is based upon and claims the benefit of priority from the prior Japanese Patent Applications No. 2002-089773, filed Mar. 27, 2002, the entire contents of which are incorporated herein by reference.

BACKGROUND OF THE INVENTION

1. Field of the Invention

The present invention relates to a clock recovery circuit which is used for, e.g., high-speed data communication.

2. Description of the Related Art

In a data communication system, in order to perform serial transmission between communication devices having clock signal sources different from each other, a communication device on a reception side requires clocks with the same frequency as that of a communication device on a transmission side. In this case, the reception side generates a sampling clock synchronized with reception data so as not to generate a frequency offset, and samples the reception data by using this clock, thereby acquiring reproduction data.

There are various kinds of clock recovery circuit which generate a sampling clock synchronized with reception data, and a clock recovery circuit using a multiphase clock is one of such circuits. In this mode, the multiphase clocks having n phases are used, and a phase comparator compares a leading (or trailing) edge of reception data with an edge of a sampling clock selected from the n-phase clocks in phase until an optimum clock is reached, thereby selecting the optimum clock from the n-phase clocks.

However, the prior art clock recovery circuit cannot correct a phase of the sampling clock to an ideal position immediately even though it tries to correct the phase of the sampling clock to the ideal position when a period with no transition of a value of the reception data is long, which leads to a problem of many reading errors of the reception data.

Therefore, there has been demanded a clock recovery circuit which produces no reading error even if the period with no transition of a value of reception data is long, in which a clock recovery system stably operates in a balanced state, and which can realize an ideal clock recovery system having a high tracking property when a large correction is required.

BRIEF SUMMARY OF THE INVENTION

According to the present invention, there is provided a clock recovery circuit comprising:

a phase comparator which detects a difference in phase between input data and a plurality of sampling clocks and outputs it a pair of first frequencies consisting of pulse signals with two values of an advanced signal and a delayed signal;

a low-pass filter which reduces the pair of first frequencies in accordance with a frequency reducing control signal which specifies a frequency reduction ratio, and outputs a pair of second frequencies;

a control signal generator which monitors the pair of second frequencies, and generates a phase control signal used to adjust phases of the sampling clocks to be small when the advanced signal and the delayed signal are outputted substantially evenly as the pair of second frequencies, and to adjust the phases of the sampling clocks to be large when one of the advanced signal and the delayed signal is larger in number than the other;

a phase interpolator which receives the phase control signal, adjusts the phases of the sampling clocks, and outputs the sampling clocks adjusted; and a frequency divider which divides one of the sampling clocks having the adjusted phases by a predetermined division ratio, outputs a frequency divided output, and controls operations of the low-pass filter and the control signal generator by using the frequency divided output.

BRIEF DESCRIPTION OF THE SEVERAL VIEWS OF THE DRAWING

FIG. 3 is a block diagram showing a clock recovery circuit according to an embodiment of the present invention;

FIGS. 10A and 10B are circuit diagrams showing an example of a phase interpolator in FIG. 3.

DETAILED DESCRIPTION OF THE INVENTION

Figure 1:
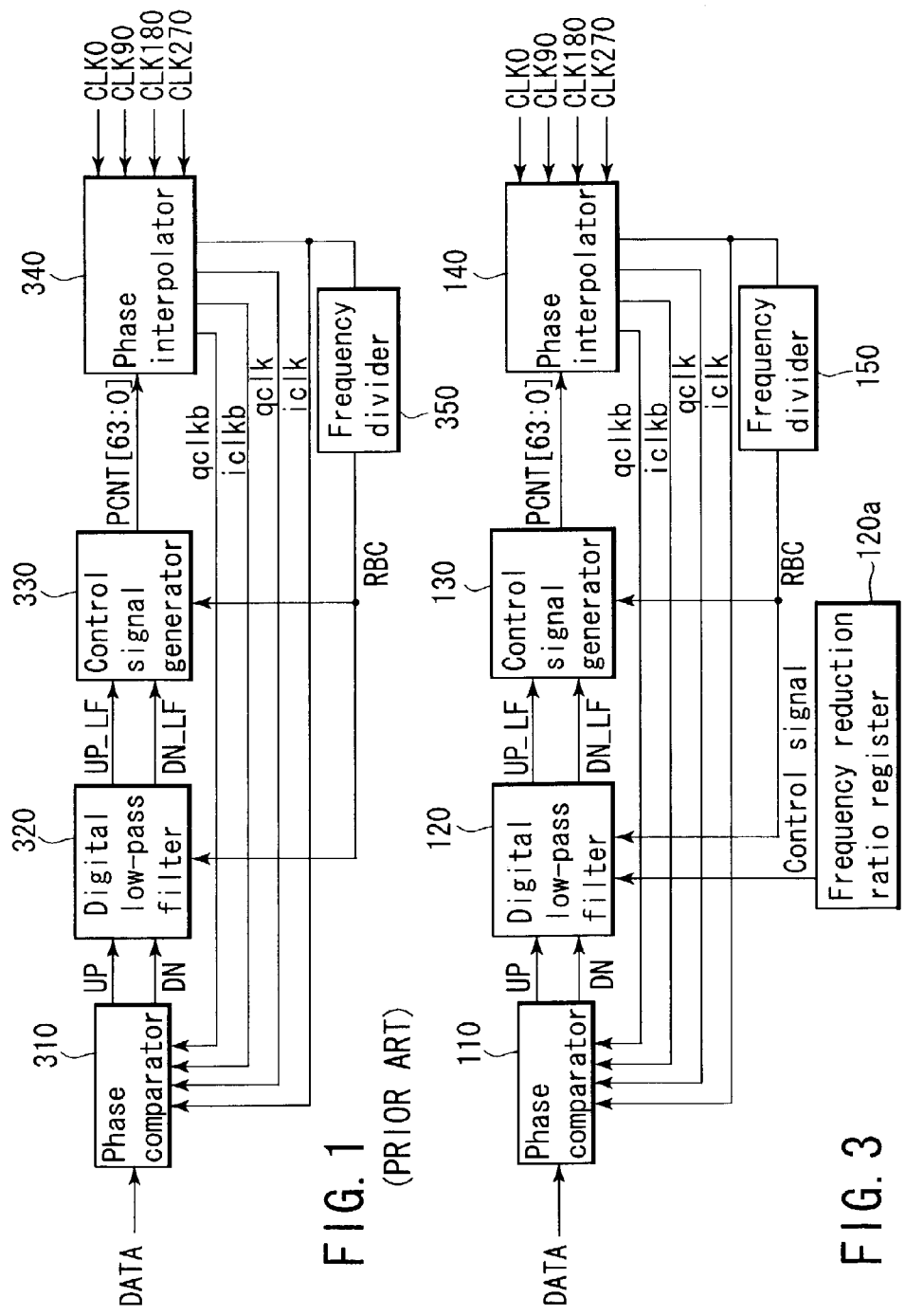
FIG. 1 is a block diagram showing an example of a conventional clock recovery circuit using multiphase clocks.

Before explaining an embodiment, problems in the conventional clock recovery circuit will be first described. FIG. 1 shows an example of a conventional clock recovery circuit using multiphase clocks. In FIG. 1, reference numeral 310 denotes a phase comparator which is of a binary type; 320, a digital low-pass filter; 330, a control signal generator; 340, a phase interpolator; and 350, a frequency divider.

The binary type phase comparator 310 reads reception data by using four-phase sampling clocks iclk, qclk, iclkb, qclkb which are generated by the phase interpolator 340 and whose phases are shifted 90°, respectively, judges the phases of the sampling clocks relative to the reception data based on two values, i.e., an advanced value and a delayed value, and outputs judgment results in the form of a signal UP and a signal DN.

In this case, since comparing values of the reception data read by using the sampling clocks iclk, qclk, iclkb and qclkb can find sampling clocks in the sampling clocks iclk, qclk, iclkb and qclkb between which the read values have changed, and hence it is possible to judge whether the phase of each sampling clock is advanced or delayed relative to the reception data.

The phase comparator 310 changes the output signal UP to "High" when the phases of the sampling clocks are behind the phase of the reception data, and changes the output signal DN to "High" when the phases of the sampling clocks are beyond the phase of the reception data. Here, "High" of the output signal UP means to advance the phases of the four-phase recovery clocks iclk, qclk, iclkb and qclkb outputted from the phase interpolator 340, and "High" of the output signal DN means to delay positions of the outputs in four phases outputted from the phase interpolator 340.

Since the gain of a transfer function of the binary type phase comparator 310 is very high, the loop gain becomes high in a clock recovery system, which results in an unstable system. Thus, in order to lower the loop gain of the clock recovery system, frequencies of the output signals UP/DN from the phase comparator 310 are lowered (thinned).

That is, the low-pass filter 320 reduces a phase comparison result (information indicative of whether the phases of the sampling clocks are advanced or delayed) obtained when a transition of the reception data is observed, and its frequency reduction ratio is set to be several-fold or more of the frequency division ratio of the frequency divider 350. For example, if an output UP (or DN) having 16 pulses is generated, a signal UP_LF (or DN_LF) of one pulse with a low frequency is generated.

The control signal generator 330 receives the signal UP_LF or DN_LF outputted from the low-pass filter 320, and generates, e.g., a control signal PCNT [63:0] of 64 bits.

Figure 2:
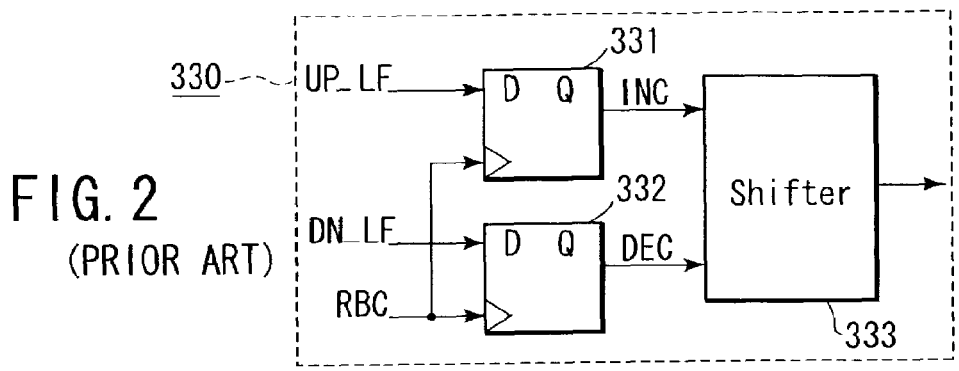
FIG. 2 is a circuit diagram showing an example of a control signal generator in FIG. 1.

FIG. 2 shows an example of the control signal generator 330 in FIG. 1. This control signal generator 330 has two flip-flop circuits 331 and 332 to which the output signals UP_LF and DN_LF from the low-pass filter 320 are inputted as a data input D and a frequency divided output RBC from the frequency divider 350 is inputted as a clock input, and a shifter 333 of, e.g., 64 bits whose data shift direction is controlled based on respective outputs INC and DEC from the two flip-flop circuits 331 and 332.

This control signal generator 330 shifts a position of "1" in the shifter 333 based on the input signals UP_LF and DN_LF, and generates the control [63:0] of 64 bits indicative of the position of "1".

The phase interpolator 340 in FIG. 1 includes a switch circuit group which receives four-phase clock signals CLK0, CLK90, CLK180 and CLK270 which are generated by dividing a reference clock on the reception side and whose phases are shifted from each other by 90°. The control signal PCNT [63:0] outputted from the control signal generator 330 controls which switch circuit in the switch circuit group is to be opened/closed. As a result, clock signals with desired phases subjected to phase adjustment are generated from the four-phase clock signals CLK0, CLK90, CLK180 and CLK270.

In this case, an amount of phase correction for one time for each of the sampling clock signals iclk, qclk, iclkb and qclkb is always constant. If an amount of phase correction for one time is large, a jitter of each of the sampling clock signals iclk, qclk, iclkb and qclkb becomes large, and hence an amount of phase correction for one time cannot be set very large in order to stabilize the system.

The frequency divider 350 in FIG. 1 generates a frequency divided output RBC by dividing the sampling clock whose phase is adjusted by the phase interpolator 340, and supplies it to the low-pass filter 320 and the control signal generator 330.

As described above, the prior art clock recovery circuit generates the control signal PCNT [63:0] by using the signals thinned in the low-pass filter 320. This control signal PCNT [63:0] is used to control the phase interpolator 340, thereby generating the sampling clocks iclk, qclk, iclkb and qclkb. The reception data is sampled by the sampling clocks, and the reception data is recognized, thus obtaining reproduction data.

Meanwhile, in the Hi-speed mode of, e.g., the USB (Universal Serial Bus) 2.0 standard, a maximum bit length with no change in the reception data is stipulated as seven bits. Also, in the 8B10B transmission mode, a maximum bit length with no change in the reception data is stipulated as 9 bits. In the actual data communication adopting such a standard and mode, there is no problem in the conventional clock recovery circuit. However, if the reception data does not change for a long time, there is the following problem.

That is, the output signals UP and DN are not generated unless there is a transition of a value of the reception data, and the control to close up a phase difference between the reception data and the sampling clock signals iclk, qclk, iclkb and qclkb does not work if the period with no transition of a value of the reception data is long. After such a state, even if there is a transition of a value of the reception data and the phase comparator 310 outputs the output signals UP and DN, the recovery clock signals iclk, qclk, iclkb and qclkb are out of ideal positions (phases). Even if there is an attempt to correct the phases of the sampling clock signals iclk, qclk, iclkb and qclkb to ideal positions, the phases of the sampling clock signals iclk, qclk, iclkb and qclkb cannot be corrected to the ideal positions immediately because the phase comparison result is greatly thinned, and many reading errors of the reception data occur.

The cause of such a problem is the fact that the frequency of the output from the phase comparator 310 is lowered (thinned) more than needs by the low-pass filter 320. The present invention is intended to solve the above-described problem. A preferred embodiment according to the present invention will now be described in detail with reference to the accompanying drawings.

FIG. 3 shows a clock recovery circuit according to an embodiment of the present invention. This clock recovery circuit is formed on, e.g., one semiconductor integrated circuit. As compared with the conventional clock recovery circuit described in connection with FIG. 1, the low-pass filter 120 and the control signal generator 130 are different, and other constituent elements are the same.

Reference numeral 110 in FIG. 3 denotes a phase comparator which is of a binary type; 120, a low-pass filter; 130, a control signal generator; 140, a phase interpolator; and 150, a frequency divider.

Like the phase comparator 310 described in connection with FIG. 1, the binary type phase comparator 110 reads input data (reception data, in this example) by using four-phase sampling clocks iclk, qclk, iclkb and qclkb which are generated by the later-described phase interpolator 140 and whose phases are shifted from each other by 90°, judges the phases of the sampling clocks iclk, qclk, iclkb and qclkb relative to the reception data based on two values, i.e., an advanced value and a delayed value, and outputs judgment results as a signal UP and a signal DN.

Figure 4:
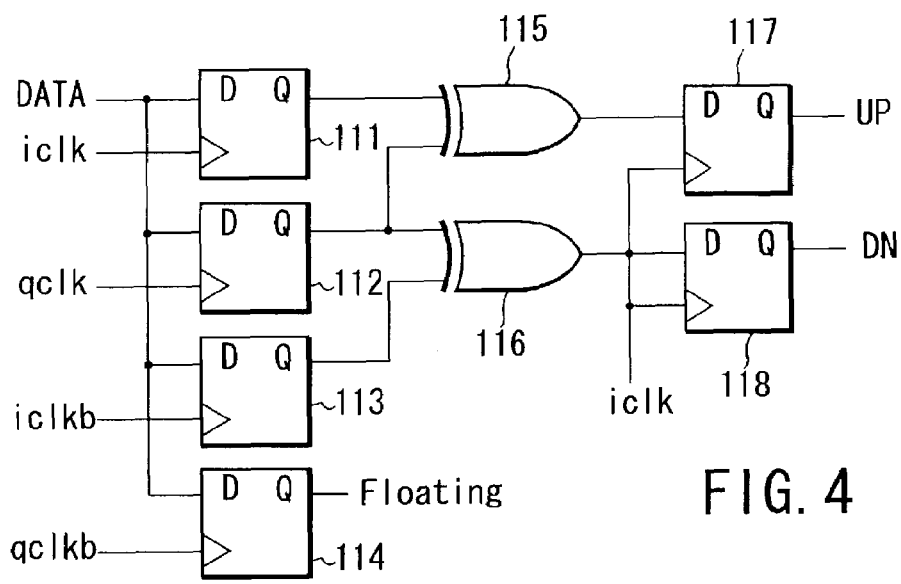
FIG. 4 is a circuit diagram showing a basic structure of a phase comparator in FIG. 3.
Figure 5:
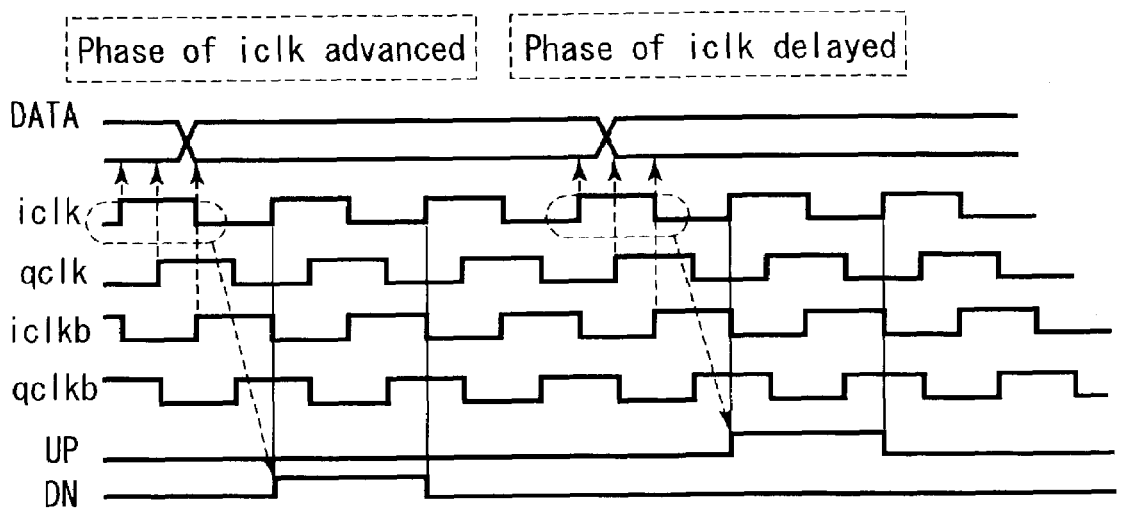
FIG. 5 is a timing waveform chart showing an operating example of the phase comparator in FIG. 3.

FIG. 4 is a circuit diagram showing a basic structure of the phase comparator 110 in FIG. 3, and FIG. 5 is a timing waveform chart showing its operation.

The circuit example in FIG. 4 has the following structure. On the input side are provided flip-flops 111 to 114 to which reception data DATA is inputted and which have four-phase sampling clocks iclk, qclk, iclkb and qclkb whose phases are shifted 90° as clocks, respectively. Outputs from the flip-flops 111 and 112 are inputted to an exclusive OR gate 115, and outputs from the flip-flops 112 and 113 are inputted to an exclusive OR gate 116. An output from the exclusive OR gate 115 is inputted to a flip-flop 117 having iclk as a clock, and the flip-flop 117 outputs a signal UP. Furthermore, an output from the exclusive OR gate 116 is inputted to a flip-flop 118 having iclk as a clock, and the flip-flop 118 outputs a signal UP. It is to be noted that the flip-flop 114 is of a floating type and uniforms load capacities of the sample clocks with four phases.

The operation of the above-described circuit is as follows. Like a part encircled by a dotted line on the left side in FIG. 5, assuming that DATA has the same value when iclk and qclk are inputted and DATA has another value when iclkb is inputted, an output from the exclusive OR gate 116 shown in FIG. 4 becomes active, and the flip-flop 118 outputs the signal DN. Moreover, with a timing such as indicated by a dotted line in the center of FIG. 5, since DATA has the same value when qclk and iclkb are inputted and DATA has another value when iclk is inputted, an output from the exclusive OR gate 115 shown in FIG. 4 becomes active, and the flip-flop 117 outputs the signal UP.

As described above, since clocks in the sampling clocks iclk, qclk, iclkb and qclkb between which read values have changed become apparent, it is possible to judge whether the phases of the sampling clocks are advanced or delayed relative to the reception data.

The phase comparator 110 changes the output signal UP to "High" when the phases of the sampling clocks are delayed relative to the phase of the reception data, and changes the output signal DN to "High" when they are advanced. Here, "High" of the output signal UP means to advance the phases of the sampling clocks with four phases iclk, qclk, iclkb and qclkb outputted from the phase interpolator 140, and "High" of the output signal DN means to delay the phases of the sampling clocks with four phases outputted from the phase interpolator 340.

Since the operation of a circuit on the rear stage becomes difficult when frequencies of the output signals UP and DN from the phase comparator 110 are too high, the low-pass filter 120 receives the output signals UP and DN from the phase comparator 110, and signals UP_LF and DN_LF having frequencies lowered from those of UP and DN are outputted.

The control signal generator 130 receives the output signals UP_LF and DN_LF from the low-pass filter 120, accumulates UP_LF and DN_LF, and monitors their values at fixed time intervals (periodically). In addition, it generates a control signal PCNT [63:0] having, e.g., 64 bits used to stepwise control a phase correction amount of the recovery clock in accordance with an accumulated value.

The phase interpolator 140 has a switch circuit group to which clock signals with four phases CLK0, CLK90, CLK180 and CLK270 which are generated from a reference clock on the reception side and whose phases are different shifted from each other by 90°, and each switch circuit to be turned on/off in this switch circuit group is controlled by using the control signal [63:0] from the control signal generator 130. The phases of the sampling clock (output clock) signals iclk, qclk, iclkb and qclkb are adjusted by using this control signal PCNT [63:0].

Figure 6:
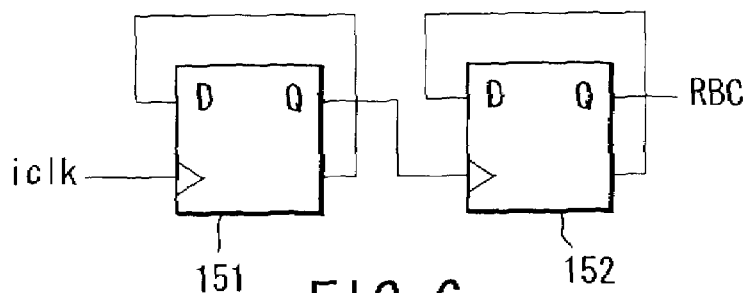
FIG. 6 is a circuit diagram showing a basic structure of a frequency divider in FIG. 3.

The frequency divider 150 divides the recovery circuit clock having the phase adjusted by the phase interpolator 140, generates a frequency divided output RBC, and supplies it to the low-pass filter 120 and the control signal generator 130. Although a known circuit can be used as the frequency divider, it can be configured by using, e.g., flip-flops 151 and 152 as shown in FIG. 6 as long as it is a quarter division type.

Figure 7A:
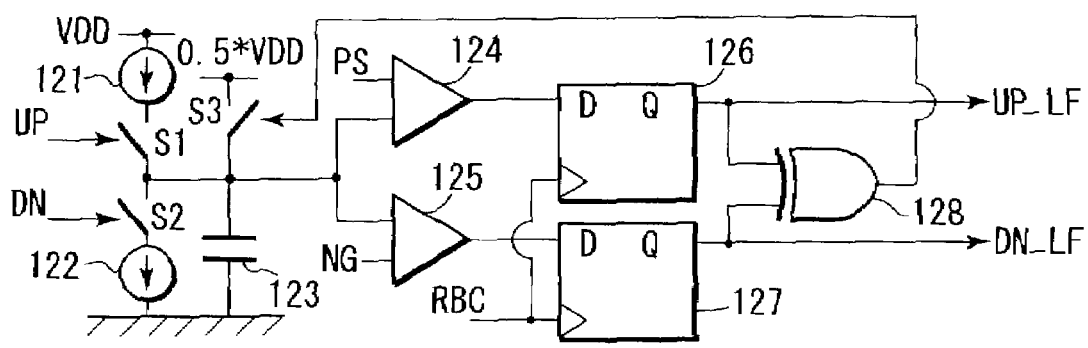
FIG. 7A is a circuit diagram showing an example of a low-pass filter in FIG. 3.

FIG. 7A shows an example of the structure of the low-pass filter 120 in FIG. 3. A constant current source 121, a switch element S1, a switch element S2 and a constant current source 122 are connected in series between a VDD node to which a power supply potential VDD is supplied and a VSS node to which a ground potential VSS is supplied. ON/OFF of the switch element S1 is controlled by the output signal UP from the phase comparator 110, and ON/OFF of the switch element S2 is controlled by the output signal DN of the phase comparator 110.

A capacitor 123 for charge/discharge is connected between the connection node of the switch elements S1 and S2 and the VSS node. Additionally, a switch element S3 used to set an initial value is connected between a 0.5*VDD node to which a potential 0.5*VDD which is a half of VDD is supplied and the connection node of the switch elements S1 and S2.

Further, a potential at the connection node between the switch elements S1 and S2 is compared with a first reference potential (upper limit potential) PS by a first voltage comparator (COMP1) 124, and also compared with a second reference potential (lower limit potential) NG by a second voltage comparator (COMP2) 125. Respective outputs from the voltage comparators 124 and 125 are inputted as data inputs D to two flip-flop circuits 126 and 127 in accordance with each other.

The two flip-flop circuits 126 and 127 receive the frequency divided output clock RBC from the frequency divider 150, and supply the respective output signals UP_LF and DN_LF to the control signal generator 130 on the rear stage. In this case, the respective output signals UP_LF and DN_LF are inputted to the exclusive OR gate 128, and switching of the switch element S3 used to set an initial value is controlled by using an output from the exclusive OR gate 128.

The low-pass filter shown in FIG. 7A operates to generate the output signals UP_LF and DN_LF whose frequencies are lower than those of the input signals UP and DN by utilizing charge/discharge of the capacitor 123 for charge/discharge.

That is, the capacitor 123 is charged when the input signal UP is active, and the capacitor 123 is discharged when the input signal DN is active. In such a charge/discharge operation, when the potential at one end of the capacitor 123 (potential at the connection node between the switch elements S1 and S2) exceeds the upper limit potential PS, the output from the first voltage comparator 124 changes to "High", and the output signal UP_LF from the flip-flop circuit 126 changes to "High". On the contrary, when the potential at one end of the capacitor 123 becomes lower than the lower limit potential NG, the output signal from the second voltage comparator 127 changes to "High", and the output signal DN_LF from the flip-flop circuit 127 changes to "High".

In this case, the two flip-flop circuits 126 and 127 fetch the output signals from the voltage comparators 124 and 125 as data inputs in synchronization with the frequency divided output clock RBC from the frequency divider 150, and generate the output signals UP_LF and DN_LF which facilitate the operation of the circuit on the rear stage.

When the output signal UP_LF or DN_LF is outputted (becomes "High"), an output from the exclusive OR gate 128 changes to "High", the switch element S3 is turned on, and the potential at one end of the capacitor 123 is returned to the initial value 0.5*VDD.

Therefore, when the signals UP and DN are inputted to the low-pass filter 120 for a "desired number of times", the output signals UP_LF and DN_LF can be changed to "High" over one cycle of the frequency division clock RBC. Here, the "desired number of times" can be determined based on a ratio between currents from the constant current sources 121 and 122 which charge/discharge the capacitor 123 and a capacitance of the capacitor 123.

Figure 7B:
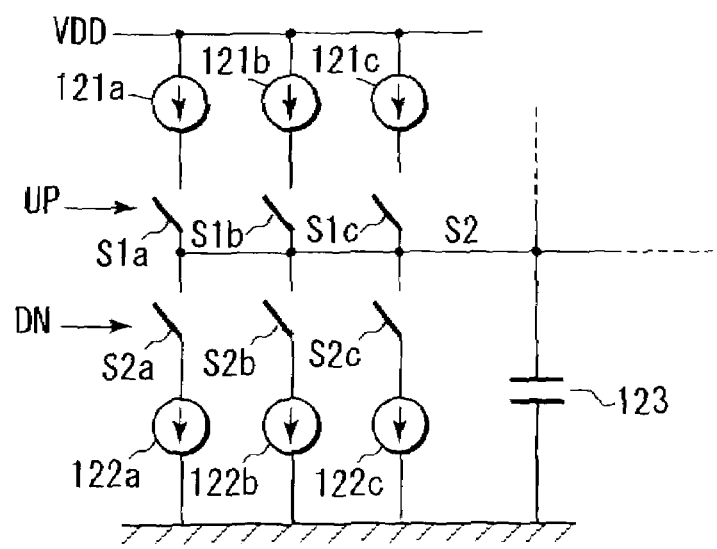
FIG. 7B shows a modification of an input portion illustrated in FIG. 7A.

This embodiment is characterized in that the "desired number of times" is not increased more than needed. That is, when a ratio of the high-speed clock iclk and the low-speed clock BRC (frequency division ratio of the frequency divider 150) is represented as N (positive integer), since the lower limit of the "desired number of times" is actually "N times", the "desired number of times" is suppressed to N or N+several times. This can be readily realized by designing values of the currents from the constant current sources 121 and 122 which charge/discharge the capacitor 123 to be large or, as shown in FIG. 7B, by forming a plurality of constant current sources 121a to 121c, and 122a to 122c having different current values and controlling the desired constant current source in accordance with a request from a user to appropriately select switches S1a to S1c and S2a to S2c based on, e.g., set data in a register 120a shown in FIG. 3.

Suppressing the "desired number of times" to N or N+several times as described above can allocate the valuable phase comparison result to phase correction of the recovery clocks as much as possible when there is little transition of the reception data. Although the "desired number of times" can be set to 2N to 3N, the problem like that in the prior art may possibly occur when it is set to 4N or higher. In other words, a proportion of the frequency reduction by the low-pass filter 120 can be controlled to bet set between N and 3N in this embodiment.

On the other hand, when the phase comparison result is very frequently reflected to phase correction of the sampling clocks, the loop gain of the control system becomes too high, which leads to an unstable control system. Therefore, the frequency of outputting the output signals UP_LF and DN_LF whose frequencies are lower than those of the input signals UP and DN to the low-pass filter 120 is monitored by the control signal generator 130, and a phase correction amount of the recovery clocks is changed based on this tendency.

Figure 8:
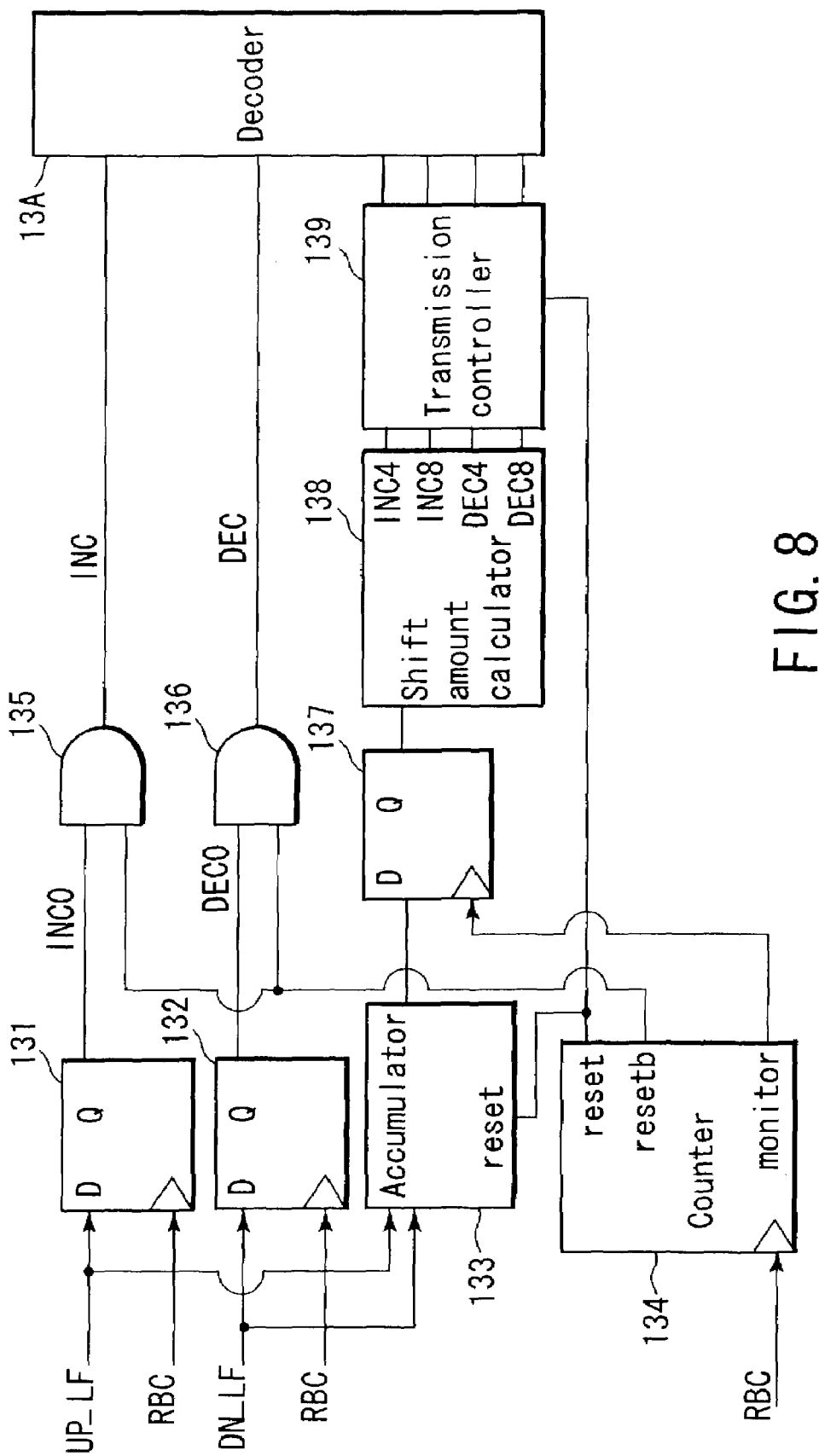
FIG. 8 is a circuit diagram showing an example of a control signal generator in FIG. 3.

FIG. 8 shows an example of the structure of the control signal generator 130 in FIG. 3. To this control signal generator 130 are provided two flip-flop circuits 131 and 132, an accumulator 133 used to calculate accumulated values of the input signals UP_LF and DN_LF, a counter 134 and a flip-flop circuit 137 used to perform monitoring processing of the accumulated values in the accumulator 133 periodically (at fixed time intervals), AND gates 135 and 136, a shift amount calculator 138, a transmission controller 139, and a decoder 13A.

The two flip-flop circuits 131 and 132 receive the input signals UP_LF and DN_LF from the low-pass filter 120 as data inputs D, also receive the frequency divided output clock RBC from the frequency divider 150 as a clock input, and generate output signals INCO and DECO as data outputs Q. These signals INCO and DECO are inputted to the AND gates 135 and 136.

The counter 134 counts the frequency output clock RBC from the frequency divider 150, and outputs a monitor pulse signal "Monitor" when a count value has reached a given value. The flip-flop circuit 137 receives the signal "Monitor" as a clock input, and stores the accumulated values of the accumulator 133.

Furthermore, the counter 134 outputs complementary reset signals "reset" and "resetb". In this case, the reset signal "reset" becomes non-active and the inversion reset signal "resetb" becomes active in a period that the above-described monitoring processing is carried out, and the reset signal "reset" becomes active and the inversion reset signal "resetb" becomes non-active with a timing after termination of the monitoring processing. The inversion reset signal "resetb" controls the AND gates 135 and 136, and the reset signal "reset" controls the accumulator 133 and the transmission controller 139.

The shift amount calculator 138 generates a signal used to largely correct the phases of the sampling clocks based on the accumulated value stored in the flip-flop circuit 137. At that time, if the accumulated value is a value, e.g., which is not less than 4 pulses and less than 8 pulses on the UP side, the signal INC4 which advances the phase of the shifter by four steps at a burst is changed to "H". If the accumulated value is a value which is not less than 8 pulses on the UP side, the signal INC8 which advances the phase by eight steps at a burst is changed to "H". On the DN side, like the UP side, if the accumulated value is a value which is not less than 4 pulses and less than 8 pulses, the signal DEC4 which delays the phase of the shifter by four steps at a burst is changed to "H". Also, if the accumulated value is a value which is not less than 8 pulses on the DN side, the signal DEC8 which delays the phase by eight steps at a burst is changed to "H".

As described above, the preparation for adjusting a phase correction amount of the sampling clocks is set by monitoring the frequency of the output signals UP_LF and DN_LF from the low-pass filter 120 by the control signal generator 130.

When actually performing phase correction of the sampling clocks, desired signals must be selected from the output signals (signals which faithfully reflect the phase comparison result) INC and DEC from the AND gates 135 and 136 and the output signals (having a large phase correction amount) INC4, INC8, DEC4 and DEC8 from the shift amount calculator 138. The counter 134, the AND gates 135 and 136, and the transmission controller 139 are used in order to realize this function.

That is, in a period that the inversion reset signal "resetb" outputted from the counter 134 is "H" (reset signal "reset" is "L"), the output signals INCO and DECO from the flip-flop circuits 131 and 132 are outputted as signals INC and DEC which faithfully reflect the phase comparison result through the AND gates 135 and 136. In this period, the transmission operation of the transmission controller 139 is in the off state.

On the contrary, in a period that the reset signal "reset" outputted from the counter 134 is "H" (inversion reset signal "resetb" is "L"), the transmission operation of the transmission controller 139 is turned on, an output from the shift amount calculator 138 is transmitted, and the accumulated value in the accumulator 133 is reset. In this period, the AND gates 135 and 136 are closed, and INC and DEC are disabled.

With such an operation, INC and DEC, which faithfully reflect the phase comparison result, are selected and supplied to the decoder 13A on the rear stage at any time other than when reading an accumulated value in the accumulator 133 by using the monitor signal "monitor" periodically outputted from the counter 134. On the contrary, when reading an accumulated value in the accumulator 133, the outputs INC4, INC8, DEC4 and DEC8 from the shift amount calculator 134 each of which has a large phase correction amount with the frequencies of UP_LF and DN_LF being taken into consideration are selected and supplied to the decoder 13A on the rear stage.

The decoder 13A is provided to receive the signals INC, DEC, INC8 and DEC8 and convert them into the control signal PCNT [63:0] of, e.g., 64 bits which is used to gradually determine a phase correction amount of each recovery clock in the phase interpolator 140. This control signal PCNT [63:0] controls a phase correction amount of each sampling clock to be small when any of the signals INC and DEC which faithfully reflect the phase comparison result is active, and controls the same to be large when any of the signals INC4, INC8, DEC4 and DEC8 each having a large correction amount is active.

Figure 9:
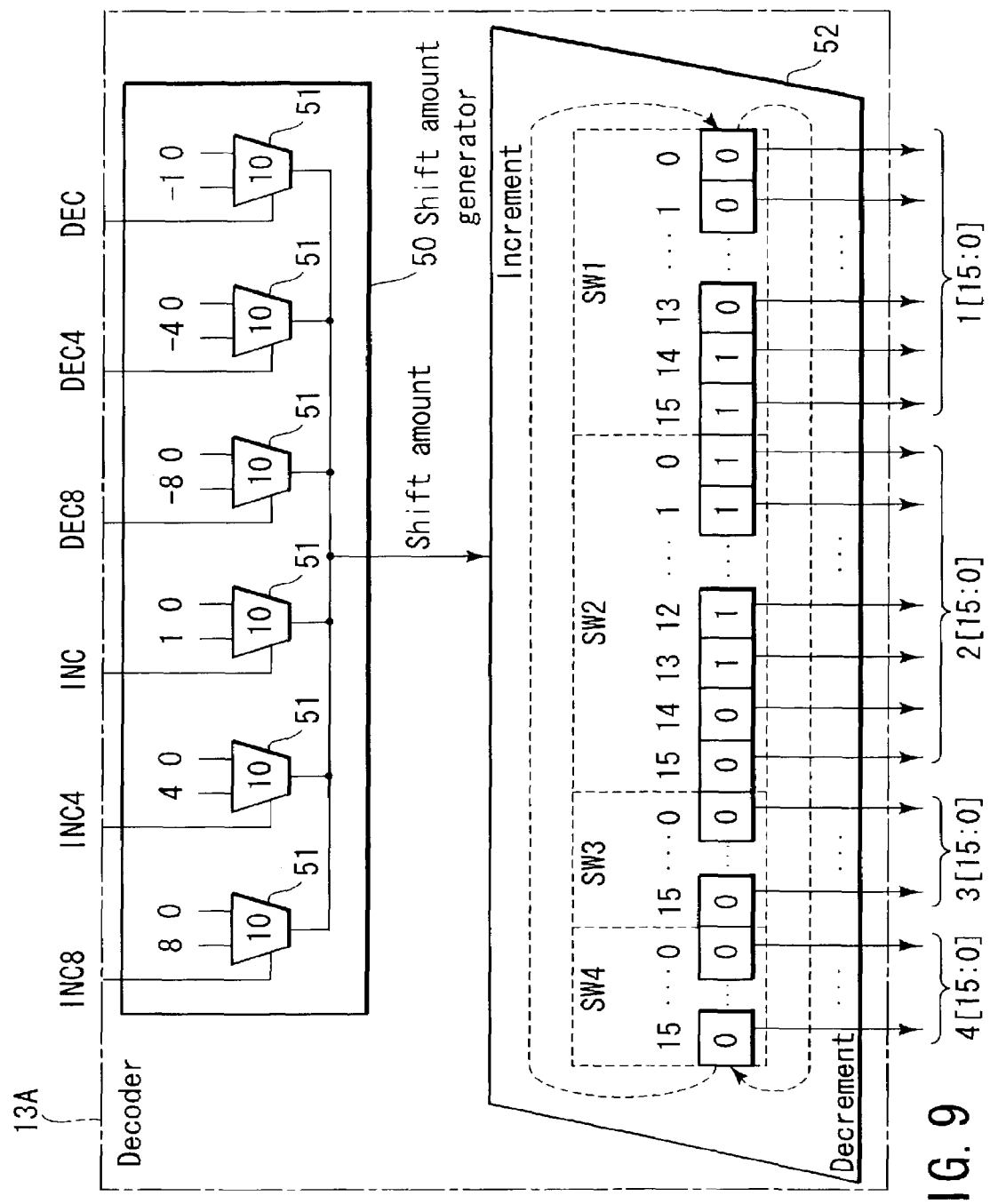
FIG. 9 is a circuit diagram showing an example of a decoder in FIG. 8.

FIG. 9 shows an example of the structure of the decoder 13A in FIG. 8. In FIG. 9, a shift amount generator 50 controls six multiplexers 51 by using the signals INC, DEC, INC4, INC8, DEC4 and DEC8 in association with each other, and selects and outputs desired shift amount data. In this case, when the signal INC is active, the multiplexers 51 selects shift amount data of +1. When the signal INC4 is active, the multiplexer 51 selects shift amount data of +4. When the signal INC8 is active, the multiplexer 51 selects shift amount data of +8. When the signal DEC is active, the multiplexer 51 selects shift amount data of −1. When the signal DEC4 is active, the multiplexer 51 selects shift amount data of −4. When the signal DEC8 is active, the multiplexer 51 selects shift amount data of −8.

The shifter 52 has a circular shift register, and "1" is written in continuous 16 bits of the shifter register while "0" is written in the remaining bits of the same. A data shift direction (increment or decrement) and a data shift amount are controlled based on the shift amount data from the shift amount generator 50. In this case, data shift of one bit is carried out by using the shift amount data of +1 or −1, data shift of four bits is carried out by using the shift amount data of +4 or −4, and data shift of eight bits is carried out by using the shift amount data of +8 or −8.

By such an operation, an output from the circular shift register having 64 bits can be used as the control signal PCNT [63:0] used to stepwise control a phase correction amount of each sampling clock based on an accumulated value. Here, the circular shift register having 64 bits is divided into four groups, and an output of continuous 16 bits from the first group is called a control signal 1 [15:0], an output of continuous 16 bits from the second group is called a control signal 2 [15:0], an output of continuous 16 bits from the third group is called a control signal [15:0], and an output of continuous 16 bits from the fourth group is called a control signal 4 [15:0].

Figure 10B:
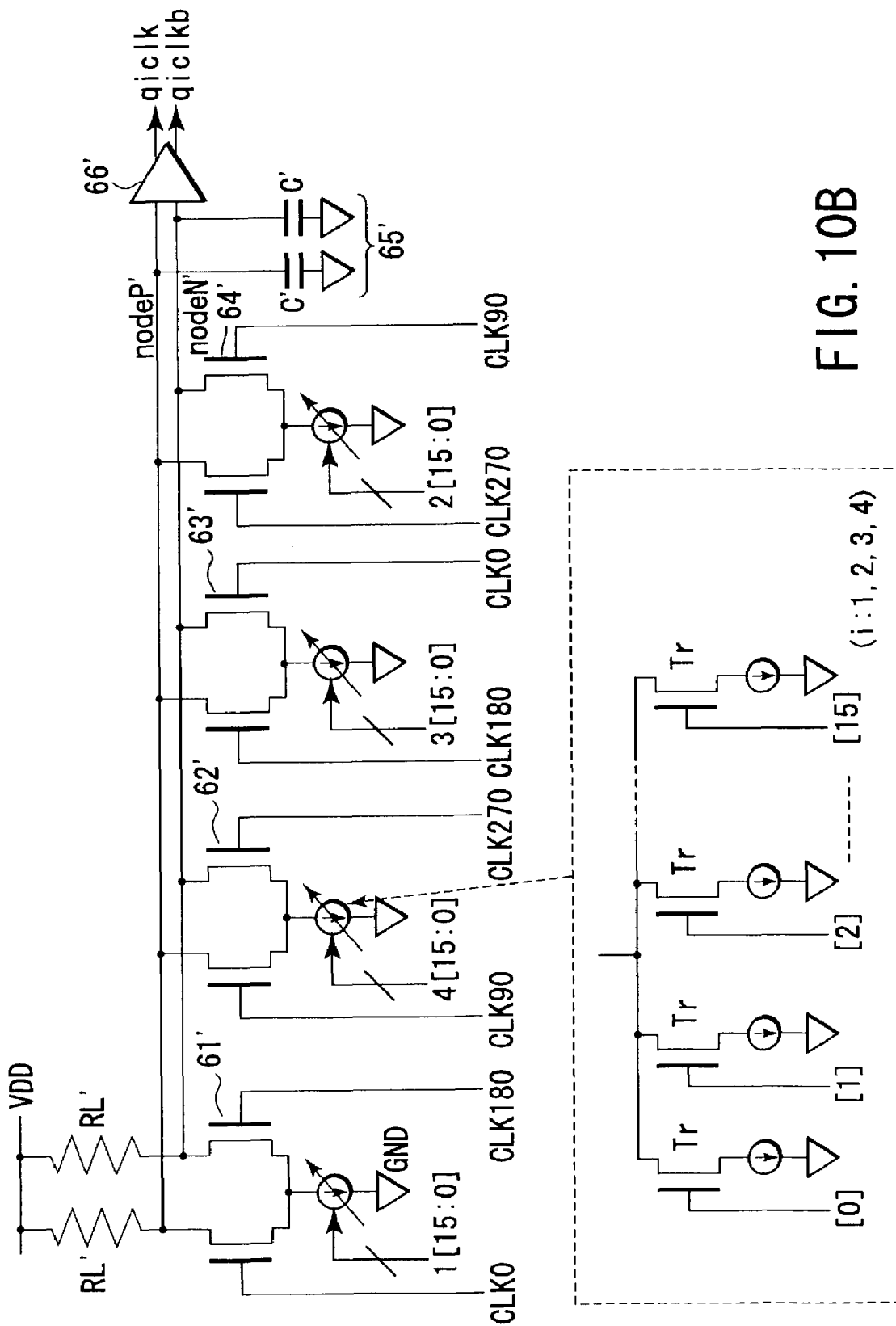

FIGS. 10A and 10B show an example of the structure of the phase interpolator 140 in FIG. 3, and FIG. 10A shows a circuit which outputs the sampling clocks iclk and iclkb whilst FIG. 10B shows a circuit which outputs qiclk and qiclkb. Since the phase interpolators shown in FIGS. 10A and 10B are different from each other only in a phase of a control signal to be inputted to a differential comparator, description will be given mainly based on FIG. 10A, and elements in FIG. 10B will be put in parentheses.

The phase interpolator shown in FIG. 10A (10B) connects a first differential comparator 61 (61') to a fourth differential comparator 64 (64') in parallel, to which two clock signals having anti-phases (CLK0, CLK180), (CLK90, CLK270), (CLK180, CLK0) and (CLK270, CLK90) among clock signals with four phases CLK0, CLK90, CLK180 and CLK270 whose phases are different from each other by 90° are inputted respectively in association with each other. The four differential comparators 61 to 64 (61' to 64') share load resistances RL (RL1), and an integrator 65 (65') using an integrating capacitor C (C') and a differential amplifier 66 (66') are connected to the output node.

Moreover, the number of switch transistors to be turned on among 16 switch transistors Tr forming a constant current source portion of each of the differential comparator 61 to 64 (61' to 64') is switched by using the control signals 1 [15:0], 2 [15:0], 3 [15:0] and 4 [15:0] inputted from the shifter 52 shown in FIG. 9 in association with the respective differential comparators 61 to 64 (61' to 64') (size of transistors to be energized is switched). As a result, a clock signal having a desired phase (accuracy of 16 steps: 90/16=5.625°) can be produced by combining two clock signals among the clock signals having four phases CLK0, CLK90, CLK180 and CLK270 with the weighting accuracy of 16 steps.

Figure 11:
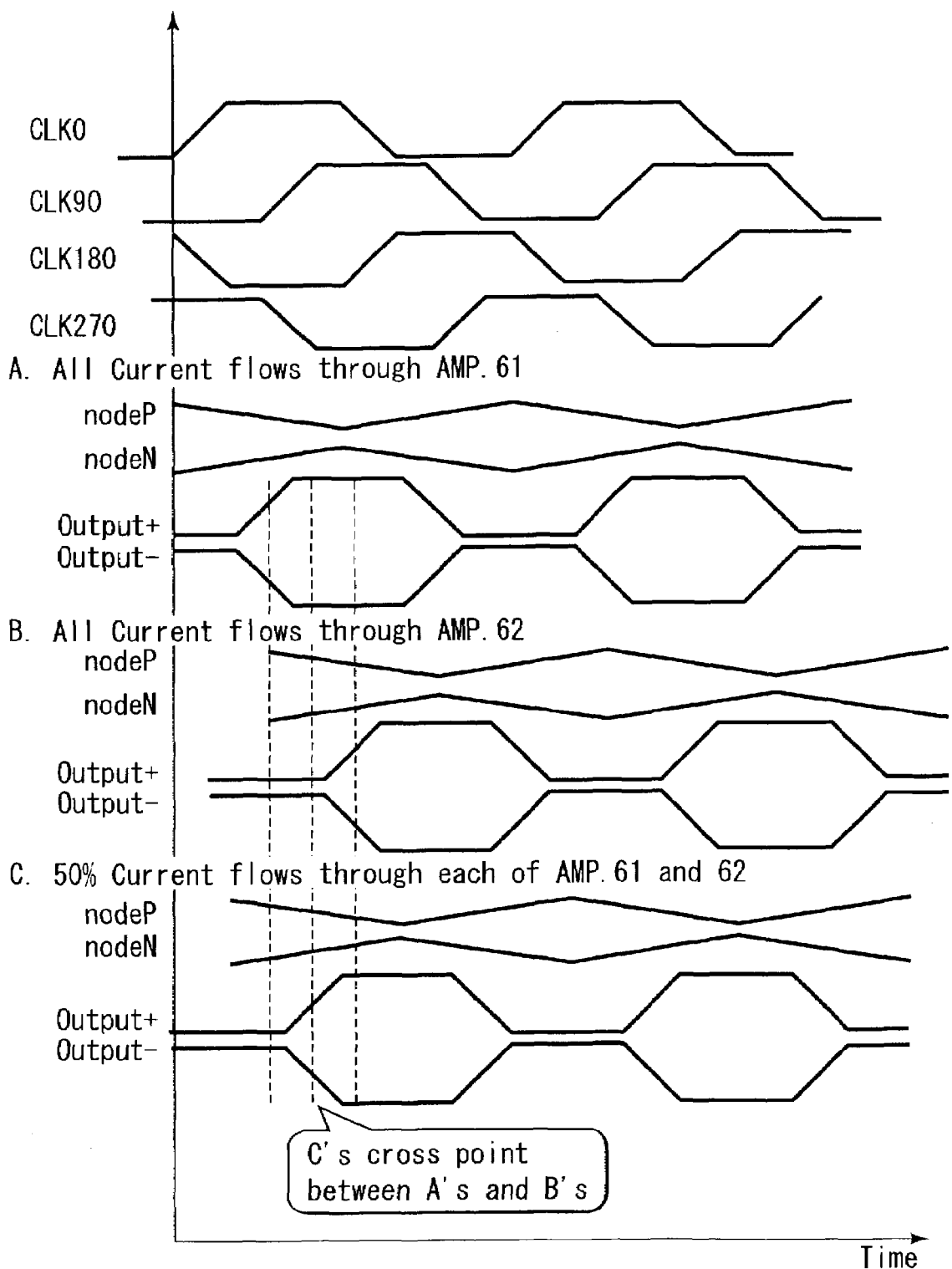
FIG. 11 is a timing waveform chart showing an example of an operation of the phase interpolator in FIG. 10A.

FIG. 11 shows an example of an operation of the phase interpolator 140 illustrated in FIG. 10A. For instance, when using 100% of the phase of the clock signal CLK0, the control signals 4 [15:0] are all set to "H" and the control signals 3 [15:0], 2 [15:0] and 1 [15:0] are all set to "L" so as to turn on all the switch transistors in the constant current portion of the first differential comparator 61 and turn off all the switch transistors in the constant current source portions of any other differential comparators 62 to 64.

In addition, when using 100% of the phase of the clock signal CLK90 which delays from the clock signal CLK0 by 90°, the control signals 3 [15:0] are all set to "H" and the control signals 4 [15:0], 2 [15:0] and 1 [15:0] are all set to "L" so as to turn on all the switch transistors in the constant current source portion of the second differential comparator 62 and turn off all the switch transistors in the constant current source portions of any other differential comparators 61, 63 and 64.

Additionally, adjacent two signals are selected from the input clock signals with four phases CLK0, CLK90, CLK180 and CLK270 whose phases are different from each other by 90° are selected, a desired weight is given to the phases of the selected signals and they are superimposed each other, thereby generating a clock signal having a desired intermediate phase.

For example, when a weight of 50% of each of CLK0 and CLK90 is given and then they are superimposed each other, a clock signal having a mean phase of those of CLK0 and CLK90 can be produced. In this case, the control signals 4 [15:8] are all set to "H", the control signals 4 [7:0] are all set to "L", the control [15:8] are all set to "L", the control [7:0] are all set to "H", and the control [15:0] and 1 [15:0] are all set to "L".

In case of advancing the phase of the clock signal generated by superimposition, a weight of the clock signal with the advanced phase is increased, e.g., increasing the weight to 60% for CLK0 and decreasing the weight 40% for CLK90. Then, superimposition is carried out.

By such an operation, the phase interpolator 140 generates and outputs the clock signal iclk whose phase is set at the center of the data eye of the reception data DATA and its inversion clock signal iclkb, and the clock signal qclk whose phase is delayed from that of the clock signal iclk by 90° and its inversion clock signal qclkb from the four input clock signals CLK0, CLK90, CLK180 and CLK270.

As described above, in this embodiment, a percentage of reducing the frequency of the phase comparator output is suppressed to the necessary minimum, and the phase comparison results with the reduced frequency are reflected on the phase adjustment. At that time, a phase correction amount for one time is adjusted in accordance with an output frequency of the phase correction signal with the reduced frequency, the phase correction amount is controlled to be small in the stable state, and it is controlled to be large when the phase of each sampling clock considerably deviates from an ideal position.

That is, according to the above-described embodiment, since the very few valuable phase comparison results are reflected on the phase correction of the sampling clocks with a high frequency, no reading error occurs even if a period of no transition of data is long. Also, since the loop gain of the system is small (system is stabilized) in the balanced state and the loop gain of the system is large when large correction is required, the ideal clock recovery system having the high follow-up property can be realized. Therefore, it is suitable for the data transmission mode that the reception data does not vary and a maximum bit length is restricted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock recovery circuit comprising:
    a phase comparator which detects a difference in phase between input data and a plurality of sampling clocks, and outputs a detected result as a pair of first frequencies consisting of pulse signals with two values of an advanced signal and a delayed signal;
    a low-pass filter which reduces the pair of first frequencies in accordance with a frequency reducing control signal which specifies a frequency reduction ratio, and outputs a pair of second frequencies, wherein the low-pass filter has a frequency reduction ratio register which specifies the frequency reduction ratio;
    a control signal generator which monitors the pair of second frequencies, and generates a phase control signal used to finely adjust phases of the sampling clocks when the advanced signal and the delayed signal are substantially evenly outputted as the pair of second frequencies, and to roughly adjust the phases of the sampling clocks when one of the advanced signal and the delayed signal is larger in number than the other;
    a phase interpolator which receives the phase control signal, adjusts the phases of the sampling clocks, and outputs the sampling clock adjusted; and
    a frequency divider which divides one of the sampling clocks having the adjusted phases by a predetermined frequency division ratio and outputs a frequency divided output, and controls operations of the low-pass filter and the control signal generator by using the frequency divided output.

2. The clock recovery circuit according to claim 1, wherein the low-pass filter controls the frequency reduction ratio so as to be equal to the predetermined frequency division ratio for the sampling clocks.

3. The clock recovery circuit according to claim 1, wherein the low-pass filter controls in such a manner that the frequency reduction ratio is set between 1/(3N) to 1/N when the predetermined frequency division ratio of the frequency divider is represented as 1/N (N is a positive integer).

4. The clock recovery circuit according to claim 1, wherein the frequency reduction ratio register has a plurality of set values as the frequency reduction ratio.

5. The clock recovery circuit according to claim 1, wherein the low-pass filter determines the frequency reduction ratio by using a ratio of a capacitance and constant currents.

6. The clock recovery circuit according to claim 5, wherein the low-pass filter charges/discharges the capacitor with the constant currents by using the pair of first frequencies as outputs from the phase comparator, and generates the advanced signal with respect to the phase when a potential of the capacitor exceeds a predetermined upper limit value, and generates the delayed signal with respect to the phase when the potential is below a predetermined lower limit value.

7. The clock recovery circuit according to claim 1, wherein the control signal generator comprises:
    an accumulator which calculates an accumulated value of outputs from the low-pass filter;
    a counter which generates a monitor signal used to monitor the accumulated value in the accumulator at fixed time intervals, and a reset signal which resets the accumulated value after monitoring;
    a first storage circuit which fetches the accumulated value by using the monitor signal generated by the counter;
    a shift amount calculator which outputs phase control signals used to stepwise change a phase correction amount of the phase interpolator by using the accumulated value fetched into the first storage circuit;
    a transmission controller which transmits the phase control signals to a rear stage circuit in accordance with the reset signal of the counter;
    second storage circuits which fetch the pair of second frequencies outputted from the low-pass filter;
    gate circuits which are controlled by the reset signal and an inversion signal from the counter and supply outputs from the second storage circuits to the rear stage circuit so as to complement the transmission controller; and
    a decoder which is provided as the rear stage circuit, and generates a phase control signal having n bits which finally controls the phase interpolator.

8. The clock recovery circuit according to claim 7, wherein the phase shift amount calculator selectively generates one of the phase control signals used to control the phase on a plurality of stages in accordance with the accumulated value of the accumulator.

9. The clock recovery circuit according to claim 8, wherein the phase shift mount calculator generates a signal which advances the phase by I stages at a burst when the accumulated value of the accumulator is X1 to X2;
    the phase shift amount calculator generates a signal which advances the phase by J stages at a burst when the accumulated value of the accumulator is not less than X3;
    the phase shift amount calculator generates a signal which delays the phase by I stages at a burst when the accumulated value of the accumulator is −X2 to −X1; and
    the phase shift amount calculator generates a signal which delays the phase by J stages at a burst when the accumulated value of the accumulator is not more than −X3, where X1, X2, X3, I and j are natural numbers, X1, X2 and X3 have the relationship of $X1<X2 \leq X3$, and I and J have the relationship of $1<I<J$.

10. The clock recovery circuit according to claim 7, wherein the decoder comprises:
- a shift amount generator which is controlled in accordance with outputs from the gate circuits and an output from the transmission controller, and has a plurality of multiplexers which select and output required shift amount data; and
- an n-bit circular shift register in which "1" is written in continuous m bits while "0" is written in the remaining bits, whose data shift direction and data shift amount for one time are controlled by the required shift amount data from the shift amount generator, and generates a phase control signal having n (>m) bits.

11. The clock recovery circuit according to claim 7, wherein the phase interpolator generates the sampling clocks by using the phase control signal and clock signals with four phases supplied from the outside.

12. The clock recovery circuit according to claim 11, wherein the phase interpolator includes two input terminals to which two signals having anti-phases among the clock signals with four phases are inputted, and a plurality of differential comparators each of which has a constant current source whose conduction is controlled by the phase control signal.

* * * * *